United States Patent
Hongbin Hao et al.

(10) Patent No.: US 6,218,869 B1
(45) Date of Patent: Apr. 17, 2001

(54) PULSE DETECTOR WITH DOUBLE RESOLUTION

(75) Inventors: Jerry Hongbin Hao, San Jose; William W. Kolb, Sunnyvale, both of CA (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 09/200,641

(22) Filed: Nov. 25, 1998

(51) Int. Cl.[7] ...................................................... H03K 5/22
(52) U.S. Cl. .................................................................. 327/24
(58) Field of Search .................................. 327/12, 18, 20, 327/24, 26, 27, 141, 142, 163, 166, 170, 172, 176, 263, 291; 375/354, 362, 364

(56) References Cited

U.S. PATENT DOCUMENTS

| | | | |
|---|---|---|---|
| 4,773,085 | * 9/1988 | Cordell | 375/120 |
| 5,299,237 | * 3/1994 | Head | 375/120 |
| 5,455,540 | * 10/1995 | Williams | 331/1 A |
| 5,485,484 | * 1/1996 | Williams et al. | 375/376 |
| 5,703,838 | 12/1997 | Gorbics et al. | 368/120 |
| 5,761,255 | * 6/1998 | Shi | 375/360 |
| 6,118,745 | * 9/2000 | Hutchins et al. | 369/59 |

OTHER PUBLICATIONS

By M. Afghahi et al., "Double Edge–Triggered D–Flip–Flops for High–Speed CMOS Circuits" IEEE Journal of Solid State Circuits, vol. 26, No. 8 Aug. 1991. pp. 1168–1170.
By S.H. Unger et al., "Clocking Schemes for High–Speed Digital Systems", IEEE Transactions on Computers, vol. C–35, No. 10, Oct. 1986, pp. 880–895.
By Honolulu, Digest of Technical Papers, "1994 Symposium on VLSI Circuits" pp. 43–44.

* cited by examiner

Primary Examiner—My-Trang Nuton

(57) ABSTRACT

A pulse edge detector for detecting edges of a pulse signal in a bit stream. The bit stream, and herewith the pulse signal, is synchronized to a clock having half the resolution of a clock signal used to transmit the bit stream. Falling and rising edges of the synchronized pulse signal are determined. It is further determined whether the falling and rising edges of the pulse signal fall within a first or a second phase of the clock signal. The determined phase result is recorded for further processing by a succeeding circuit such as a counter. By determination of the pulse phase in both phases of the clock pulse, a double resolution pulse edge detector is obtained.

9 Claims, 3 Drawing Sheets

PULSE DETECTOR WITH DOUBLE RESOLUTION

FIELD OF THE INVENTION

The present invention relates to a pulse edge detector. Such a pulse edge detector can be used to detect whether the baud rate of pulses within a bit stream such as an asynchronous bit stream is within a required specification. Typically, the bit stream is generated by a serial interface of a computer.

BACKGROUND OF THE INVENTION

Serial interfaces are well-known in personal computer, or the like. Such serial interfaces comprise a so-called UART (Universal Asynchronous Receiver Transmitter) for generating an asynchronous bit stream comprised of data words, usually bytes, preceded by a START-bit and succeeded by a STOP-bit. The baud rate of such an asynchronous bit stream may vary. Pulse signals comprised in the bit stream can be distorted by noise picked up by a transmission line via which the bit stream is conveyed to a device receiving the asynchronous bit stream. The receiving device, which first synchronizes itself to the received bit stream, checks whether pulse signals comprised in the bit stream are within given specifications, i.e., checks the accuracy of the wave form of the pulse. The receiving device usually comprises synchronous circuitry comprised of flip flops and gate circuits. A problem might arise if, for some reason, e.g., to achieve power savings, a system clock signal of the receiving device is half the clock frequency of the personal computer generating the asynchronous bit stream. Then, a detector comprised in the receiving device cannot accurately detect whether the pulse signal is within the required specifications. So, what is needed is a baud rate detector having double resolution.

For other purposes, some form of double resolution schemes are known.

In the article "Double Edge-Triggered D-Flip-Flops for High-Speed CMOS Circuits", M.

Afghahi et al., IEEE Journal of Solid-State Circuits, Vol. 26, No. 8, August 1991, pp. 1168–1170, discloses a double edge-triggered flip flop which responds to both edges of a clock pulse. Such a double edge-triggered flip flop can be used in a repeater inserted in a long transmission line.

In the article "Clocking Schemes for High-Speed Digital Systems", S. H. Unger et al., IEEE Transactions on Computers, Vol. C-35, No. 10, October 1986, pp. 880–895, discloses the use of double edge-triggered D-flip flops in a clocking scheme for a high speed digital system.

In the U.S. Pat. No. 5,703,838 a Vernier delay line interpolator to be used with a coarse counter clocked by a clock signal is disclosed for measuring time intervals. By delaying a clock signal in a multiple-tapped delay line, an interpolator is obtained to be used for measuring signal time intervals with a resolution higher than the resolution of the clock signal used in the timing interval detector. Such a combination of a coarse counter and a delay line interpolator can be used in time of flight measurements to infer a particle type. Typically, resolutions as low as 25 picoseconds can be obtained.

In the Article, "1994 Symposium on VLSI Circuits", Honolulu, Digest of Technical Papers, pp. 43–44, a high speed interface is disclosed for a multiprocessor interconnection network. To achieve higher transfer rates, among other measures, sampling of data is done on both edges of a clock signal. A receiver phase shifts a transmitter clock by 90° and uses both edges to sample incoming data.

SUMMARY OF THE INVENTION

It is an object of the invention to provide a pulse edge detector for detecting edges of a pulse signal in a bit stream with a resolution which is double the resolution of a clock signal to be used by the detector.

It is another object of the invention to provide a pulse edge detector with simple and low cost circuitry to obtain double resolution.

In accordance with the invention, a pulse edge detector for detecting edges of a pulse signal in a bit stream, is provided which detector comprises:

a clock input terminal for a clock signal to be fed to the detector, a bit stream input terminal for the asynchronous bit stream, a synchronizing means for synchronizing the pulse signal to the clock signal, a falling edge generating means for generating a falling edge signal representing a falling edge of the synchronized pulse signal, a rising edge generating means for generating a rising edge signal representing a rising edge of the synchronized pulse signal, pulse signal phase determining means for determining a first pulse phase signal representing whether the falling edge signal falls within a first phase of the clock signal or in a second phase of the clock signal and for determining a second pulse phase signal representing whether the rising edge signal falls within the first or the second phase of the clock signal, and output generating means for generating a first detector output signal representing the first and the second pulse phase signal.

The falling and rising edge generating means being coupled to the synchronizing means, the pulse signal phase determining means being coupled to the falling and rising edge generating means and to the bit stream input terminal, and the output generating means being coupled to the pulse signal phase determining means and to the falling and rising edge generating means.

The invention is based upon the insight that input changes can be distinguished with double the resolution of the system clock by adding some simple logic, without having the need to clock a succeeding counter on both edges of the system clock.

Preferably, the pulse signal phase determining means comprises a first flip flop circuit which is clocked by an inverse clock signal. With, in principal, as compared to a single resolution detector, the addition of only one additional flip flop circuit, and some further simple logic circuitry, a simple and low cost pulse edge detector is obtained which can be used in a baud rate detector, for instance.

Preferably, the pulse signal phase determining means further comprises a second flip flop circuit, a first AND-gate and a first NOR-gate.

Preferably, the output generating means comprises a third flip flop circuit, and a first and a second OR-gate.

Preferably, the falling and rising edge generating means comprise a shared fourth flip flop circuit, and a respective second NOR-gate and second AND-gate.

Preferably, the synchronizing means comprises a fifth flip flop circuit.

Thus, the first flip flop circuit is clocked by the inverse clock signal, whereas the second, third, fourth, and fifth flip flops are clocked by the clock signal.

DESCRIPTION OF THE PREFERRED EMBODIMENT

Figure 1:
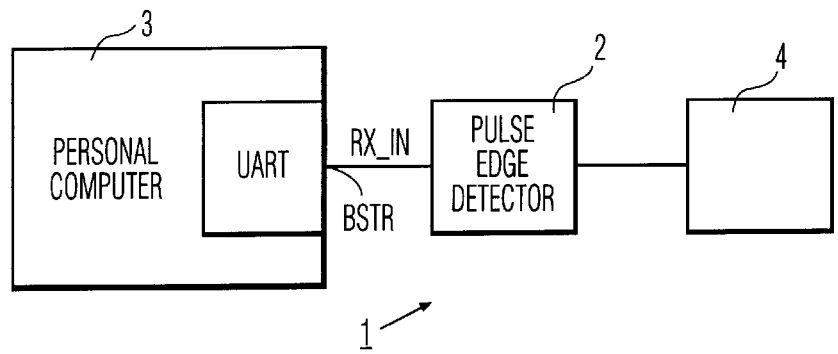
FIG. 1 schematically shows a system comprising a pulse edge detector according to the invention.

FIG. 1 schematically shows a system 1 comprising a pulse edge detector 2 according to the invention. The pulse edge generator 2 detects whether a pulse signal RX_IN in a received asynchronous bit stream BSTR as generated by a UART comprised in a personal computer 3 complies with predetermined specifications. The UART typically provides a serial bit stream with data bytes preceded by a START bit and succeeded by a STOP bit, such a serial bit stream being well-known in the art and not having been shown in more detail here. The pulse edge detector 2 provides detector output signals to a succeeding circuit 4, typically comprising a state machine (not shown in detail) processing the detector output signals. The succeeding circuit 4 decides from the output signals of the pulse edge detector 2 whether it should reject or accept a detected pulse signals X_IN, and further, in case of acceptance, processes the received bit stream BSTR. The bit stream BSTR is generated with a clock frequency which is twice as high as the clock frequency with which the pulse edge detector 2 operates.

Figure 2:
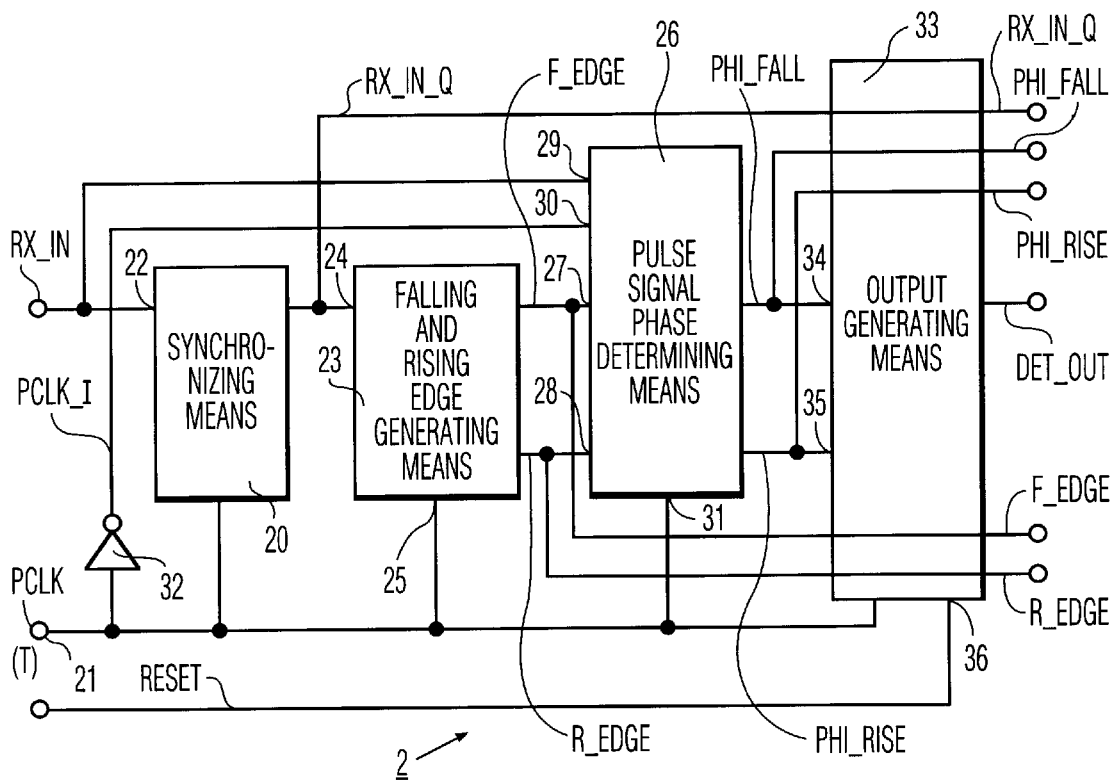
FIG. 2 is a block diagram of a pulse edge detector according to the invention.

FIG. 2 is a block diagram of the pulse edge detector 2 according to the invention. The pulse edge detector 2, which is a synchronous circuit which is clocked by a clock signal PCLK with a clock period T provided at a clock input terminal 21, comprises synchronizing means 20 for synchronizing the asynchronous bit stream BSTR to the clock signal T, the bit stream BSTR being received at a bit stream input terminal 22. Among other output signals, synchronized pulses RX_IN_Q are supplied to the circuit 4. The synchronized pulses RX_IN_Q are fed to a falling and rising edge generation means 23 having input terminals 24 and 25 for receiving the signals RX_IN_Q and PCLK, respectively. The falling and rising edge generation means 23 generates respective falling and rising edge signals F_EDGE and R_EDGE, representative of a falling edge and a rising edge of the synchronized pulse signal RX_IN_Q. The falling and rising edge signals F_EDGE and R_EDGE are fed to pulse signal phase determining means 26 having input terminals 27 and 28 for receiving the falling and rising edge signals F_EDGE and R_EDGE. The pulse signal phase determining means 26 has further input terminals 29, 30 and 31 for receiving the pulse signal RX_IN, an inverted clock signal PCLK_I obtained from the clock signal PCLK via and inverter 32, and the clock signal PCLK, respectively. The pulse signal phase determining means 26 determines a first pulse phase signal PHI_FALL representing whether the falling edge signal F_EDGE falls within a first or a second phase of the clock signal PCLK, and determines a second pulse phase signal PHI_RISE representing whether the rising edge signal R_EDGE falls within a first or second phase of the clock signal PCLK. Herewith, effectively the resolution of the pulse edge detector 2 is doubled so that with a succeeding counter (not shown) the baud rate of the bit stream BSTR, which was transmitted while using a clock at double speed, can be accurately determined. The pulse phase signals PHI_FALL and PHI_RISE are fed to output generating means 33 having input terminals 34 and 35 for receiving the first and the second pulse phase signals PHI_FALL and PHI_RISE, respectively. The output generating means 33 generates a first detector output signal DET_OUT representing the first and the second pulse phase signals PHI_FALL and PHI_RISE, i.e., at the occurrence of the signal PHI_FALL the detector output signal DET_OUT changes state, and also at the occurrence of the signal PHI_RISE the detector output signal DET_OUT changes state. Herewith, the circuit 4 receives information about the pulse signal RX_IN with double the resolution of the clock signal PCLK. The output generating means 33 also provides the signals RX_IN_Q, PHI_FALL PHI_RISE, F_EDGE, and R_EDGE to the circuit 4 for further processing and event triggering. The output generating means 33 further has a reset terminal 36 to which a reset signal RESET is fed for resetting the output generating means 33.

Figure 3:
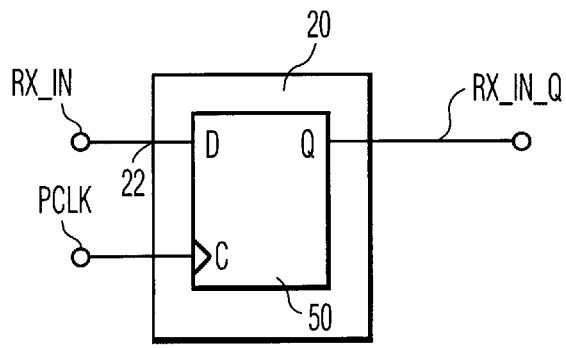
FIG. 3 is a circuit diagram of synchronizing means in a pulse edge detector according to the invention.

FIG. 3 is a circuit diagram of the synchronizing means 20 in the pulse edge detector 2 according to the invention, the means 20 comprising a D-flip flop 50 (data flip flop), with a data input D, a clock input C, and an output Q.

Figure 4:
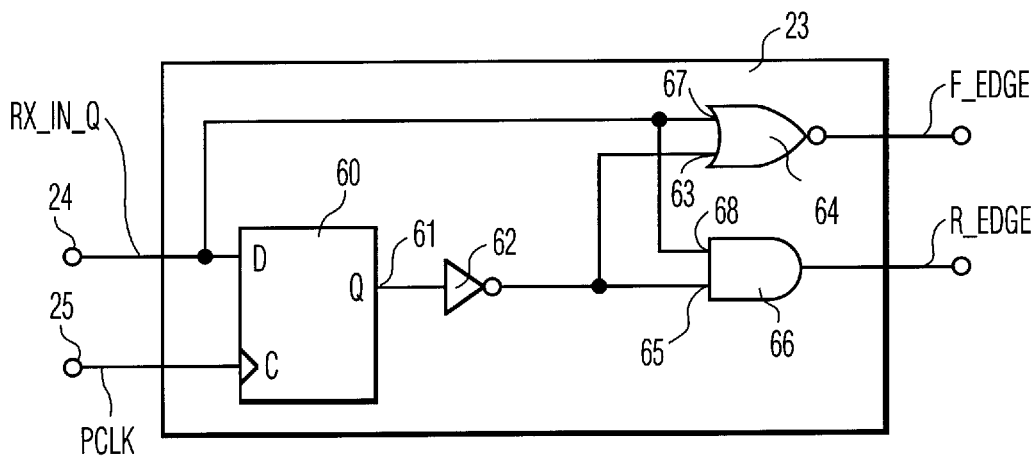
FIG. 4 is a circuit diagram of falling and rising edge generation means in a pulse edge detector according to the invention.

FIG. 4 is a circuit diagram of the falling and rising edge generation means 23 in the pulse edge detector 2 according to the invention, the means 23 comprising a D-flip flop 60 which at its input side is coupled to the input terminals 24 and 25, and with an output 61 to an inverter 62 which is coupled to an input 63 of a NOR-gate 64, and further to an input 65 of an AND-gate 66. The NOR-gate 64 has a further input 67 and the AND-gate 66 has a further input 68, the further inputs 67 and 68 being coupled to the input 24.

Figure 5:
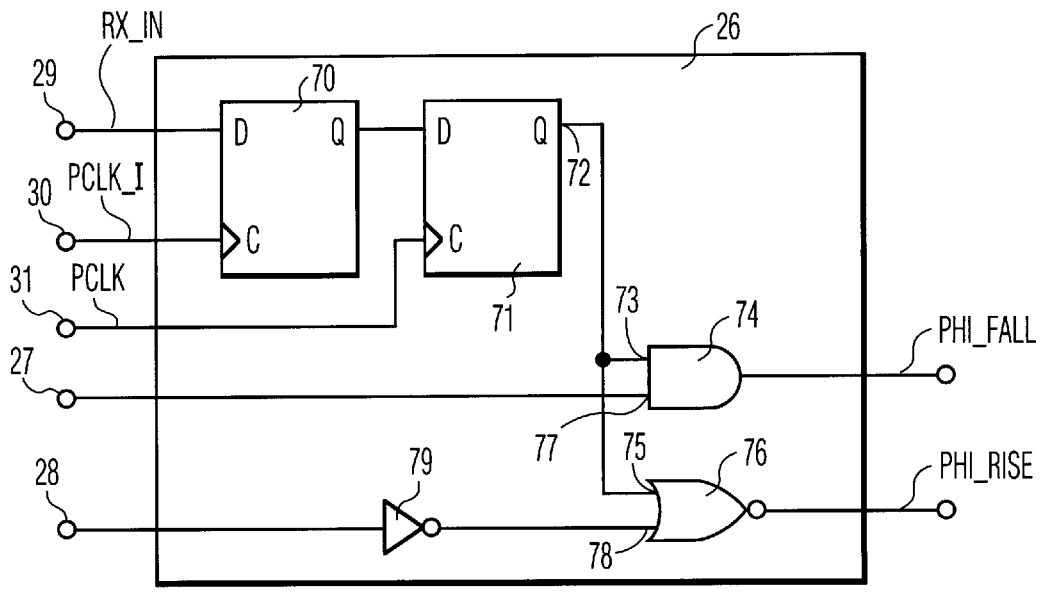
FIG. 5 is a circuit diagram of pulse signal phase determining means in a pulse edge detector according to the invention.

FIG. 5 is a circuit diagram of the pulse signal phase determining means 26 in the pulse edge detector 2 according to the invention, the means 26 comprising a D-flip flop 70 coupled to the inputs 29 and 30, at its output side, the D-flip flop 70 being coupled to a D-flip flop 71. The D-flip flop 70 is clocked with the clock signal PCLK and the D-flip flop 71 is clocked with the inverse clock signal PCLK_I. An output 72 of the D-flip flop 71 is coupled with an input 73 of an AND-gate 74 and with an input 75 of a NOR-gate 76, the AND-gate 74 and the NOR-gate 76 providing the signals PHI_FALL and PHI_RISE, respectively. The AND-gate 74 has a further input 77 which is coupled to the input 27, and the NOR-gate 76 has a further input 78 which is coupled to the input 28 via an inverter 79.

Figure 6:
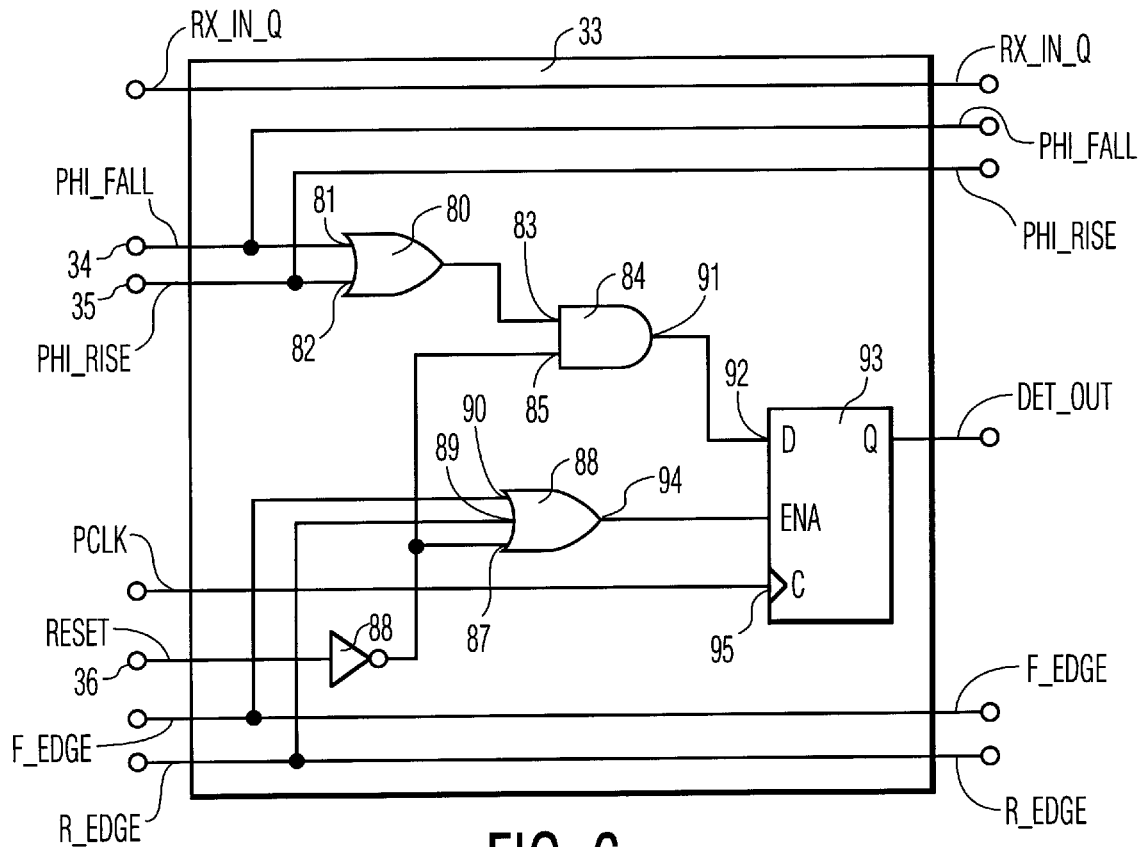
FIG. 6 is a circuit diagram of output generating means in a pulse edge detector according to the invention.

FIG. 6 is a circuit diagram of the output generating means 33 in the pulse edge detector 2 according to the invention, the means 33 comprising an OR-gate 80 having inputs 81 and 82 which are coupled to the inputs 34 and 35, respectively. At output side, the OR-gate 80 is coupled to an input 83 of an AND-gate 84 a further input 85 of which is coupled to the reset mput 36 via an inverter 86 and further to an input 87 of an OR-gate 88. The OR-gate 88 has further inputs 89 and 90 to which the signals F_EDGE and R_EDGE are fed, respectively. The AND-gate 84 has an output 91 which is coupled to a data input of a D-flip flop 93. An enable input ENA of the D-flip flip 93 is coupled to an output 94 of the OR-gate 88. The clock signal PCLK is fed to a clock input 95 of the D-flip flop 93.

Figure 7:
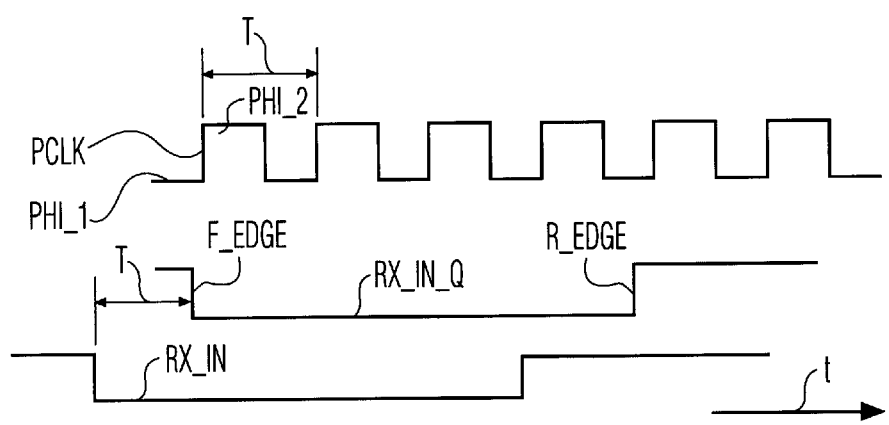
FIG. 7 is a timing diagram for illustrating the operation of a pulse edge detector according to the invention.

FIG. 7 is a timing diagram showing signals a function of time t, for illustrating the operation of the pulse edge detector 2 according to the invention. Shown are the clock signal PCLK, the pulse signal RX_IN, and the synchronized pulse signal RX_IN_Q. As can be seen, the falling and rising edge signals F_EDGE fall within a first phase PHI_1 of the clock signal PCLK. Because it also can be determined whether the signals F_EDGE and R_EDGE fall within a second phase PHI_2 of the clock signal PCLK, double resolution of the pulse edge detector is obtained.

In view of the foregoing it will be evident to a person skilled in the art that various modifications may be made within the spirit and the scope of the invention as hereinafter defined by the appended claims and that the invention is thus not limited to the examples provided. Instead of D-flip flops other types of flip flop can equally well be used. Also, the gate logic can be replaced by equivalent gate circuitry as will be well recognized by a person skilled in the art.

What is claimed is:

1. A pulse edge detector for detecting edges of a pulse signal in a bit stream, which detector comprises:

a clock input terminal for a clock signal to be fed to the detector, a bit stream input terminal for the bit stream, a synchronizing means for synchronizing the pulse signal to the clock signal, a falling edge generating means for generating a falling edge signal representing a falling edge of the synchronized pulse signal, a rising edge generating means for generating a rising edge signal representing a rising edge of the synchronized pulse signal, pulse signal phase determining means for determining a first pulse phase signal representing whether the falling edge signal falls within a first phase of the clock signal or in a second phase of the clock signal and for determining a second pulse phase signal representing whether the rising edge signal falls within the first or the second phase of the clock signal, and output generating means for generating a first detector output signal representing the first and the second pulse phase signal, the falling and rising edge generating means being coupled to the synchronizing means, the pulse signal phase determining means being coupled to the falling and rising edge generating means and to the bit stream input terminal, and the output generating means being coupled to the pulse signal phase determining means and to the falling and rising edge generating means.

2. A pulse edge detector of claim 1, wherein the pulse signal phase determining means comprises a first flip flop circuit which is clocked by an inverse clock signal.

3. A pulse edge detector of claim 2, wherein the pulse signal phase determining means further comprises a second flip flop circuit which is coupled to the first flip flop circuit, and a first gate logic circuit of which a first input is coupled to an output of the second flip flop circuit, of which a second input is coupled is coupled to the falling edge generating means, and of which a third input is coupled to the rising edge generating means, the second flip flop circuit being clocked by the clock signal.

4. A pulse edge detector of claim 3, wherein the first gate logic circuit comprises a first AND-gate and a first NOR-gate, respective inputs of the first AND-gate being coupled to the falling edge generating means and the output of the second flip flop circuit, respective inputs of the first NOR-gate being coupled to the rising edge generating means and the output of the second flip flop circuit.

5. A pulse edge detector of claim 1, wherein the output generating means comprises a third flip flop circuit of which an input is coupled to the signal phase determining means via a second gate logic circuit, and of which a further input is coupled to the falling and rising edge generating means via a third gate logic circuit, the third flip flop circuit being clocked by the clock signal.

6. A pulse edge detector of claim 5, wherein the second gate logic circuit is a first OR-gate and the input of the third flip flop circuit is a data input.

7. A pulse edge detector of claim 5, wherein the third gate logic circuit is a second OR-gate and the further input of the third flip flop circuit is an enable input.

8. A pulse edge detector of claim 1, wherein falling edge and rising edge generating means comprise a shared fourth flip flop circuit, the falling edge generating means comprises a second NOR-gate which is coupled to the fourth flip flop circuit via an inverter, and the rising edge generating means comprises a second AND-gate which coupled to an output of the inverter, the pulse signal being fed to respective other inputs of the second NOR-gate and the second AND-gate, the fourth flip flop circuit being clocked by the clock signal.

9. A pulse edge detector of claim 1, wherein the synchronizing means comprises a fifth flip flop circuit which is clocked by the clock signal and to a data input of which the pulse signal is fed.

* * * * *